(12) United States Patent
Braune et al.

(10) Patent No.: US 8,461,604 B2
(45) Date of Patent: Jun. 11, 2013

(54) OPTOELECTRONIC MODULE HAVING A CARRIER SUBSTRATE AND A PLURALITY OF RADIATION-EMITTING SEMICONDUCTOR COMPONENTS

(75) Inventors: Bert Braune, Wenzenbach (DE); Jörg Erich Sorg, Regensburg (DE); Walter Wegleiter, Nittendorf (DE); Karl Weidner, Munich (DE); Oliver Wutz, Regensburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 13/121,128

(22) PCT Filed: Aug. 25, 2009

(86) PCT No.: PCT/DE2009/001217
§ 371 (c)(1),
(2), (4) Date: Sep. 12, 2011

(87) PCT Pub. No.: WO2010/034278
PCT Pub. Date: Apr. 1, 2010

(65) Prior Publication Data
US 2011/0309377 A1      Dec. 22, 2011

(30) Foreign Application Priority Data
Sep. 26, 2008  (DE) .................... 10 2008 049 188

(51) Int. Cl.
| | | |
|---|---|---|
| H01L 29/18 | (2006.01) | |
| H01L 33/00 | (2010.01) | |
| H01L 29/06 | (2006.01) | |
| H01L 31/0328 | (2006.01) | |
| H01L 31/0336 | (2006.01) | |
| H01L 31/072 | (2006.01) | |
| H01L 31/109 | (2006.01) | |
| H01L 27/15 | (2006.01) | |
| H01L 29/26 | (2006.01) | |
| H01L 31/12 | (2006.01) | |
| H01L 29/207 | (2006.01) | |
| H01L 29/22 | (2006.01) | |
| H01L 29/227 | (2006.01) | |

(52) U.S. Cl.
USPC .................. 257/88; 257/13; 257/79; 257/93; 257/94; 257/98; 257/E33.001; 257/E33.002; 257/E33.066

(58) Field of Classification Search
USPC ............. 257/13, 79, 88, 93, 94, 98, E33.001, 257/E33.002, E33.066
See application file for complete search history.

(56) References Cited

U.S. PATENT DOCUMENTS

| 6,066,861 | A | 5/2000 | Hohn et al. | |
| 7,115,911 | B2 * | 10/2006 | Chang et al. | ..................... 257/81 |

(Continued)

FOREIGN PATENT DOCUMENTS

| DE | 103 53 679 | 6/2005 |
| DE | 10 2007 011 123 | 9/2008 |

(Continued)

Primary Examiner — Ida M Soward
(74) Attorney, Agent, or Firm — Cozen O'Connor (57) ABSTRACT

An optoelectronic module is described including a carrier substrate and a plurality of radiation-emitting semiconductor components. The carrier substrate includes structured conductor tracks. The radiation-emitting semiconductor components each include an active layer suitable for generating electromagnetic radiation, a first contact area and a second contact area. The first contact area is in each case arranged on that side of the radiation-emitting semiconductor components that is remote from the carrier substrate. The radiation-emitting semiconductor components are provided with an electrically insulating layer, which in each case has a cutout in a region of the first contact area. Conductive structures are arranged in regions on the electrically insulating layer. One of the conductive structures electrically conductively connects at least the first contact area of a radiation-emitting semiconductor component to a further first contact area of a further radiation-emitting semiconductor component or to a conductor track of the carrier substrate. A method for producing such a module is also described.

9 Claims, 3 Drawing Sheets

U.S. PATENT DOCUMENTS

| | | | |
|---|---|---|---|
| 7,208,769 B2 * | 4/2007 | Guenther et al. | 257/88 |
| 7,439,549 B2 * | 10/2008 | Marchl et al. | 257/88 |
| 7,821,023 B2 * | 10/2010 | Yuan et al. | 257/98 |
| 8,039,846 B2 * | 10/2011 | Lee | 257/79 |
| 8,039,849 B2 * | 10/2011 | Lam | 257/88 |
| 8,058,669 B2 * | 11/2011 | Chen et al. | 257/99 |
| 2006/0035036 A1 | 2/2006 | Yim et al. | |
| 2006/0138441 A1 * | 6/2006 | Kromotis et al. | 257/99 |
| 2007/0045648 A1 * | 3/2007 | Lin | 257/99 |
| 2007/0131958 A1 * | 6/2007 | Hsu et al. | 257/99 |
| 2007/0190290 A1 | 8/2007 | Gunther et al. | |
| 2008/0117619 A1 * | 5/2008 | Pang et al. | 362/84 |
| 2008/0197363 A1 * | 8/2008 | Lee et al. | 257/88 |
| 2009/0272991 A1 * | 11/2009 | Lee et al. | 257/91 |
| 2009/0305448 A1 * | 12/2009 | Shakuda | 438/46 |
| 2010/0006870 A1 * | 1/2010 | Lee et al. | 257/88 |
| 2010/0224890 A1 * | 9/2010 | Keller et al. | 257/93 |
| 2011/0024772 A1 * | 2/2011 | Diamantidis | 257/88 |

FOREIGN PATENT DOCUMENTS

| | | |
|---|---|---|
| EP | 1 724 848 | 11/2006 |
| EP | 1 914 814 | 4/2008 |
| JP | 61-290780 | 12/1986 |
| WO | WO 98/12757 | 3/1998 |
| WO | WO 03/012884 | 2/2003 |
| WO | WO 2005/062389 | 7/2005 |

* cited by examiner

OPTOELECTRONIC MODULE HAVING A CARRIER SUBSTRATE AND A PLURALITY OF RADIATION-EMITTING SEMICONDUCTOR COMPONENTS

RELATED APPLICATIONS

This is a U.S. national stage of application No. PCT/DE2009/001217, filed on Aug. 25, 2009.

This patent application claims the priority of German patent application 10 2008 049 188.8 filed Sep. 26, 2008, the disclosure content of which is hereby incorporated by reference.

FIELD OF THE INVENTION

The present invention relates to an optoelectronic module comprising a carrier substrate and a plurality of radiation-emitting semiconductor components. Furthermore, the invention relates to a method for producing an optoelectronic module.

BACKGROUND OF THE INVENTION

In conventional optoelectronic modules, wire bonding and soldering or chip mounting with conductive adhesive are predominantly used as techniques for making electrical contact between a chip and a carrier. By way of example, LED arrays for illumination modules arise in this way. In the course of miniaturization, ever smaller dimensions of the modules, such as, for example, the module height and/or the base area of the modules, are desired.

One miniaturized construction and connection technique for LEDs is known from the published patent application DE 10 353 679 A1, for example. In this case, a component comprises a carrier with a semiconductor chip arranged thereon, which is contact-connected in a planar fashion.

Modules comprising semiconductor chips contact-connected in a planar fashion advantageously have a small component height, as a result of which preferably a minimum distance between the light exit area of the semiconductor chip and optical components provided can be obtained. However, the base area of the module cannot readily be reduced by the planar contact-connection since conductive structures which are arranged on the carrier and which serve for making electrical contact with the semiconductor chips have to be integrated into the module in an electrically insulated fashion.

Particularly in the case of modules having a plurality of radiation-emitting semiconductor components, a compact arrangement of the optoelectronic components on the carrier substrate is desired.

SUMMARY OF THE INVENTION

One object of the invention is to provide an optoelectronic module having, in particular, a small structural height and at the same time a compact arrangement of a plurality of radiation-emitting semiconductor components.

This and other objects are attained in accordance with one aspect of the invention directed to an optoelectronic module comprising a carrier substrate and a plurality of radiation-emitting semiconductor components. The carrier substrate has structured conductor tracks for making electrical contact with the radiation-emitting semiconductor components. The radiation-emitting semiconductor components each comprise an active layer suitable for generating electromagnetic radiation, a first contact area and a second contact area, wherein the first contact area is in each case arranged on that side of the radiation-emitting semiconductor components which is remote from the carrier substrate. The radiation-emitting semiconductor components are provided with an electrically insulating layer, which in each case has a cutout in a region of the first contact area of the radiation-emitting semiconductor components. Conductive structures are arranged in regions on the electrically insulating layer. One of the conductive structures electrically conductively connects at least the first contact area of a radiation-emitting semiconductor component to a further first contact area of a further radiation-emitting semiconductor component or to a conductor track of the carrier substrate.

Therefore, the electrical contact-connection of the radiation-emitting semiconductor components is not effected by wires led at a distance from the carrier substrate, but rather by a conductive structure led at least partly on the electrically insulating layer. This type of electrical contact-connection advantageously results in a particularly small structural height of the module. Furthermore, a compact module can be provided by virtue of the conductive structure which electrically conductively connects the radiation-emitting semiconductor components among one another or to a conductor track of the carrier substrate. Thus, the radiation-emitting semiconductor components of the module can be arranged on the carrier substrate in a space-saving manner. The base area of the module is thus advantageously reduced.

Furthermore, a close arrangement of the conductive structure to the radiation-emitting semiconductor components is possible. This type of contact-connection of the radiation-emitting semiconductor components results in a particularly small structural height of the module, which advantageously enables, in particular, a close arrangement of optical elements, for example, to the radiation-emitting semiconductor components.

Optical elements should be understood to mean lenses, for example. In particular, optical elements are understood to mean components which influence the radiation emitted by a semiconductor component in a targeted manner, in particular change the emission characteristic.

The radiation-emitting semiconductor components are preferably semiconductor chips, particularly preferably light-emitting diodes (LED).

The radiation-emitting semiconductor components each comprise an active layer. The active layer in each case comprises a pn junction, a double heterostructure, a single quantum well (SQW) structure or a multi quantum well (MQW) structure for generating radiation. In this case, the designation quantum well structure does not exhibit any significance with regard to the dimensionality of the quantization. It therefore encompasses, inter alia, quantum wells, quantum wires and quantum dots and any combination of these structures.

Preferably, the radiation-emitting semiconductor components are in each case based on a nitride, phosphide or arsenide compound semiconductor. In the present context, "based on nitride, phosphide or arsenide compound semiconductors" means that the active epitaxial layer sequence or at least one layer thereof comprises a III/V semiconductor material having the composition $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$.

In one preferred configuration, the radiation-emitting semiconductor components are each embodied as thin-film semiconductor components. In the context of the application, a thin-film semiconductor component is considered to be a semiconductor component during whose production the growth substrate onto which a semiconductor layer sequence comprising a semiconductor body of the thin-film semiconductor component was grown, for example epitaxially, has been stripped away. The radiation-emitting semiconductor components are in each case connected to a carrier substrate that is different than the growth substrate for the semiconductor layer sequence of the semiconductor component.

The carrier substrate is advantageously not subject to the comparatively stringent requirements that have to be met by a growth substrate, for instance with regard to the crystal structure. Consequently, more materials are available for the choice of material of the carrier substrate than for the choice of material of the growth substrate.

The electrically insulating layer is preferably at least partly radiation-transmissive to the radiation emitted by the active layer of the radiation-emitting semiconductor components. The radiation emitted by the radiation-emitting semiconductor components can thus be coupled out through the electrically insulating layer without significant optical losses being incurred in the process. Absorption of the radiation emitted by the active layer in the electrically insulating layer can thereby advantageously be reduced, such that the efficiency of the module advantageously increases. Preferably, the absorption of the radiation of the radiation-emitting semiconductor components that is emitted by the active layer in the electrically insulating layer is less than 40%, particularly preferably less than 20%.

The electrically insulating layer is preferably a film, a resist or a polymer layer.

In one preferred configuration, the electrically insulating layer contains at least one conversion element. Suitable conversion elements, such as a YAG: Ce powder, for instance, are described in WO 98/12757, for example, the content of which in this respect is hereby incorporated by reference.

The radiation-emitting semiconductor components each preferably emit a primary radiation having a wavelength $\lambda_0$. The conversion element in the electrically insulating layer preferably at least partly absorbs radiation having the wavelength $\lambda_0$ and emits a secondary radiation in a different wavelength range. As a result, the module emits mixed radiation containing the primary radiation of the radiation-emitting semiconductor components and the secondary radiation of the conversion element.

Through a suitable choice of the conversion element, it is possible to effect a change in the color locus of the radiation emitted by the radiation-emitting semiconductor components. As a result, a desired color locus of the radiation emitted by the module can advantageously be obtained.

The color locus is understood hereinafter to mean the numerical values that describe the color of the emitted light of the module in the CIE color space.

Alternatively, the electrically insulating layer can contain more than one conversion element. This results in a mixed radiation of the radiation emitted by the module, containing primary radiation and a plurality of secondary radiations of the plurality of conversion elements. Through the use of more than one conversion element, it is advantageously possible to effect a precise color selection of the color locus, thus resulting in a desired color locus of the emitted radiation of the module.

It should be noted that it is not absolutely necessary for the radiation-emitting semiconductor components in each case to emit primary radiation in the same wavelength range. Rather, the radiation-emitting semiconductor components can be embodied such that they at least partly emit radiation in different wavelength ranges. Through a superimposition of the radiation emitted by the semiconductor components, a mixed radiation emitted by the module can thus be generated which is preferably in the white color region of the CIE color space.

In one preferred configuration, a planarization layer is arranged at least between the individual radiation-emitting semiconductor components.

A planar module surface remote from the carrier substrate can advantageously be obtained by virtue of the planarization layer. Preferably, the electrically insulating layer is arranged on said planar surface. Particularly preferably, the planarization layer is electrically insulating.

In one configuration of the module, the planarization layer contains at least one conversion element. Particularly preferably, the conversion element absorbs radiation emitted by at least one of the radiation-emitting semiconductor components and converts said radiation into radiation in a different wavelength range, such that mixed radiation of the radiation emitted by the module is generated.

By virtue of the fact that the conversion element or the conversion elements is/are integrated directly in the electrically insulating layer and/or in the planarization layer, advantageously no further optical layers are required. Optical layers are, inter alia, layers that alter and/or correct the color locus of the radiation emitted by the radiation-emitting semiconductor components in a targeted manner. By virtue of the fact that the conversion element is integrated in the electrically insulating layer and/or the planarization layer, and the radiation-emitting semiconductor components are preferably surrounded directly by the planarization layer and/or the electrically insulating layer, the radiation emitted by the radiation-emitting semiconductor components is advantageously converted close to the radiation-emitting semiconductor components. A compact module is thereby advantageously made possible.

In this case, the electrically insulating layer can thus perform the functions of a light conversion layer, of a carrier layer for the conductive structure, and of a protective layer for the radiation-emitting components.

In one preferred configuration of the module, the radiation-emitting semiconductor components are jointly surrounded by a frame arranged on the carrier substrate.

The frame preferably contains a ceramic or a plastic. By means of the frame, the radiation-emitting semiconductor components are spatially delimited from the surrounding medium. Furthermore, the frame advantageously protects the radiation-emitting semiconductor components against, for example, environmental influences such as, for example, impacts or ingress of moisture.

In one preferred configuration of the module, the carrier substrate is a flexible substrate.

It is accordingly not absolutely necessary for the carrier substrate to be embodied in a rigid fashion. In particular, the carrier substrate can be embodied as a film.

In one preferred configuration of the module, that surface of the carrier substrate on which the radiation-emitting semiconductor components are arranged is non-planar.

The carrier substrate can therefore have a curvature, for example. In particular, the surface of the carrier substrate can also have other shapings as long as it is possible to mount the radiation-emitting semiconductor components on one of the surfaces of the carrier substrate.

In one preferred configuration of the module, the conductive structures are formed by an anisotropic layer which is arranged on the electrically insulating layer and which has electrically conductive regions in each case at least in the region of the first contact area of the radiation-emitting semiconductor components.

Accordingly, the anisotropic film partially has regions which are conductive. This conductivity can arise, for example, as a result of a locally applied pressure or irradiation. The conductive regions of the anisotropic film in each case ensure an electrical connection of the radiation-emitting semiconductor components.

The anisotropic film is preferably at least partly radiation-transmissive to the radiation emitted by the semiconductor components. In particular, the anisotropic film is particularly preferably at least partly radiation-transmissive to the radiation emitted by the semiconductor components in regions in which no conductivity is formed.

Alternatively, the anisotropic film can be removed in regions. In particular, in this case, the anisotropic film is preferably removed in each case in the region of the radiation exit side of the radiation-emitting semiconductor components.

In one preferred configuration of the module, the electrically insulating layer is formed by means of a structured circuit board and the conductive structures are formed by means of electrically conductive webs projecting from the circuit board.

The webs preferably in each case lead from a contact location of a conductor track of the circuit board to the first contact area of a radiation-emitting semiconductor component. In this case, the webs are in each case preferably shaped such that they are curved away from the circuit board in the direction of the semiconductor components. The circuit board preferably has cutouts which are particularly preferably each arranged above the first contact area of a radiation-emitting semiconductor component. Preferably, the webs are metal webs.

The circuit board preferably comprises conductor tracks. The conductor tracks of the circuit board are in each case preferably arranged in a manner electrically insulated from one another. Particularly preferably, this electrical insulation is effected by means of the cutouts that achieve a distance between the conductor tracks of the circuit board.

In this configuration of the module, it is also possible for a plurality of circuit boards to be arranged one above another, such that a multilayered arrangement is formed. As a result, a plurality of interconnection planes of the module are advantageously possible, as a result of which a higher level of circuit integration is advantageously obtained in the module.

In a further preferred configuration of the module, the electrically insulating layer is led in regions at the side areas of the respective radiation-emitting semiconductor component around the respective radiation-emitting semiconductor component. The first contact area of the radiation-emitting semiconductor components is in each case led on the electrically insulating layer in such a way that the surface of the radiation-emitting semiconductor components which is remote from the carrier substrate is free of the first contact area.

By virtue of the first contact layer being led in this way, a homogeneous energization of the radiation-emitting semiconductor components is ensured. Furthermore, it thus becomes possible to arrange an external electrical connection of the radiation-emitting semiconductor components at any desired regions of the first contact layer.

Preferably, the electrically insulating layer is led at the side areas of the semiconductor component over the active layer of the semiconductor component.

The first contact area of the semiconductor components that is led in this way enables an electrical connection of the semiconductor components or a complex interconnection of the semiconductor components among one another. A space-saving arrangement of the semiconductor components on the carrier substrate is advantageously possible as a result.

Another aspect of the invention is directed to a method for producing an optoelectronic module comprises, in particular, the following steps:

a) arranging a plurality of radiation-emitting semiconductor components on a carrier substrate, wherein the carrier substrate has structured conductor tracks for making electrical contact with the radiation-emitting semiconductor components, the radiation-emitting semiconductor components each comprise an active layer suitable for generating electromagnetic radiation, a first contact area and a second contact area, wherein the first contact area is in each case arranged on that side of the radiation-emitting semiconductor components which is remote from the carrier substrate, b) applying an electrically insulating layer to the radiation-emitting semiconductor components, wherein the electrically insulating layer in each case has a cutout in the region of the first contact area of the respective radiation-emitting semiconductor component, and c) applying conductive structures to partial regions of the electrically insulating layer, wherein one of the conductive structures electrically conductively connects at least the first contact area of a radiation-emitting semiconductor component to a further first contact area of a further radiation-emitting semiconductor component or to a conductor track of the carrier substrate.

Advantageous configurations of the method arise analogously to the advantageous configurations of the module, and vice versa.

The electrical contact-connection of the semiconductor components by means of planar conductive structures advantageously minimizes the height of the module. At the same time, the base area of the module is advantageously reduced comparatively in relation to conventional modules.

The use of an electrically insulating layer on which are led conductive structures for making electrical contact with the semiconductor components advantageously leads to a simplification of the construction process of the modules. The interconnection of the semiconductor components, the encapsulation of the semiconductor components and, if appropriate, the light conversion, which is preferably effected by conversion elements integrated in the electrically insulating layer, are advantageously effected in each case by means of a coating process.

In one preferred configuration of the method, the conductive structures are applied by means of a printing method. Preferably, the conductive structures are applied to the electrically insulating layer by means of a screen printing method, a stencil printing method or a pad printing method.

Alternatively, the conductive structures can be applied by means of vapor deposition.

In this case, it is possible for the conductive structures to be applied by means of physical vapor deposition (PVD process) or chemical vapor deposition (CVD process).

Particularly preferably, the conductive structures are applied partially. Selective application of the conductive structures is preferably effected by means of printing, spraying or by means of PVD/CVD in conjunction with a mask technique, in particular a stencil.

A further possibility for applying the conductive structures consists in directly printing conductor tracks onto the electrically insulating layer.

In a further preferred configuration, the conductive structures are formed by means of an anisotropic layer which is arranged on the electrically insulating layer and which is embodied in electrically conductive fashion at least in the region of the first contact area of the radiation-emitting semiconductor components.

The electrically conductive regions of the anisotropic layer are preferably formed by means of a printing method, a thermal method, or irradiation, for example by means of a UV laser.

Alternatively, the conductor structures can be integrated in a film that is laminated onto the electrically insulating film. In this case, the laminated-on film comprises conductive structures, for example metallizations. These conductive structures are preferably already arranged in the film in such a way as to enable electrical contact to be made with the radiation-emitting semiconductor components in an envisaged manner. Particularly preferably, an automatic contact-making method (TAB method: tape automated bonding) is employed for this purpose.

In one preferred configuration of the method, before the electrically insulating layer is applied, a planarization layer is introduced at least into the interspaces between the radiation-emitting semiconductor components. In this way, the module is planarized such that a module surface remote from the carrier substrate is embodied in a planar fashion.

In a further preferred configuration of the method, the conductive structures are in each case embodied as an electrically conductive web, wherein the webs are in each case electrically conductively connected to the first contact area of a radiation-emitting semiconductor component by means of a stamping-wedge process.

DETAILED DESCRIPTION OF THE DRAWINGS

Identical or identically acting constituent parts are in each case provided with the same reference symbols. The constituent parts illustrated and also the size relationships of the constituent parts among one another should not be regarded as true to scale.

Figure 1:
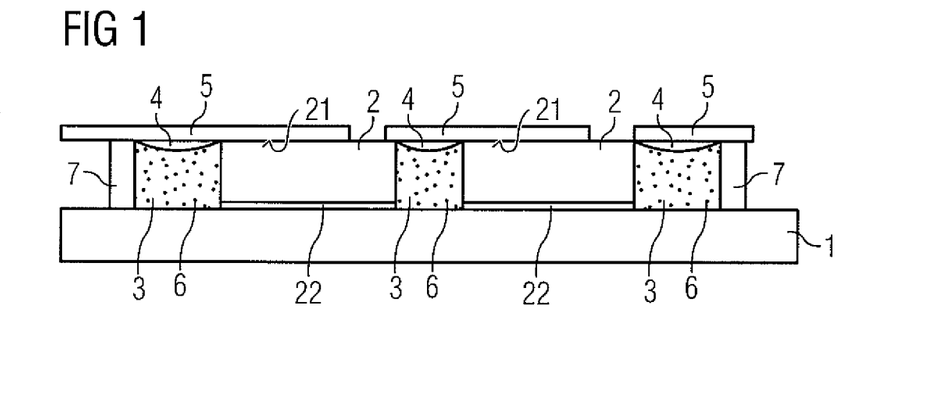
FIG. 1 shows a schematic cross section of a first exemplary embodiment of a module in one intermediate step of the production method.

FIG. 1 illustrates an optoelectronic module comprising a carrier substrate 1 and a plurality of radiation-emitting semiconductor components 2. The radiation-emitting semiconductor components 2 each comprise an active layer for generating electromagnetic radiation, a first contact area 21 and a second contact area 22. The first contact area 21 is arranged on that surface of the radiation-emitting semiconductor components 2 which is remote from the carrier substrate 1.

The radiation-emitting semiconductor components 2 are preferably embodied as semiconductor chips, particularly preferably in each case a light-emitting diode (LED).

The active layers of the radiation-emitting semiconductor components 2 each comprise a pn junction, a double heterostructure, a single quantum well structure or a multi quantum well structure for generating radiation. Preferably, the radiation-emitting semiconductor components 2 are in each case based on a nitride, phosphide or arsenide compound semiconductor.

The carrier substrate 1 has structured conductor tracks for making electrical contact with the radiation-emitting semiconductor components 2. In particular, preferably a radiation-emitting semiconductor component 2 is respectively arranged on a conductor track of the carrier substrate 1. That means that the second contact area 22 is in each case in mechanical and electrical contact with a conductor track of the carrier substrate 1.

Preferably, the conductor tracks on which a radiation-emitting semiconductor component 2 is respectively arranged are electrically insulated from one another. The radiation-emitting semiconductor components 2 are therefore arranged in a manner electrically insulated from one another on the conductor tracks of the carrier substrate 1.

Preferably, a planarization layer 3 is arranged between the individual radiation-emitting semiconductor components 2. A planar module surface remote from the carrier substrate 1 can advantageously be produced by virtue of the planarization layer 3. Preferably, the planarization layer 3 is electrically insulated; particularly preferably, the planarization layer 3 contains a dielectric material.

Preferably, the planarization layer 3 is based on silicone. In particular, the planarization layer 3 contains silicone. Additionally or alternatively, the planarization layer 3 can contain other polymers or inorganic materials.

The height of the planarization layer 3 can exceed the height of the radiation-emitting semiconductor components 2. In particular, the planarization layer 3 can be led beyond the height of the radiation-emitting semiconductor components 2, such that it runs at least partly over those surfaces of the radiation-emitting semiconductor components 2 which are remote from the carrier substrate 1. In particular, an improved electrical insulation of the radiation-emitting semiconductor components 2 is thereby ensured. In this case, the planarization layer 3 preferably consists of a material that is at least partly radiation-transmissive to the radiation emitted by the radiation-emitting semiconductor components 2.

The planarization layer 3 can furthermore contain at least one conversion element 6. Preferably, the conversion element 6 absorbs the radiation emitted by at least one of the radiation-emitting semiconductor components 2 and converts said radiation into radiation in a different wavelength range, such that mixed radiation of the radiation emitted by the module is generated.

Through a suitable choice of the conversion element 6, it is possible to effect a change in the color locus of the radiation emitted by the radiation-emitting semiconductor components 2. As a result, a desired color locus of the radiation emitted by the module can advantageously be obtained. Particularly preferably, the module emits radiation in the white color locus range.

Preferably, the radiation-emitting semiconductor components 2 are jointly surrounded by a frame 7 arranged on the carrier substrate 1.

The frame 7 preferably contains a ceramic or a plastic. In the exemplary embodiment from FIG. 1, the radiation-emitting semiconductor components 2 and the planarization layer 3 are spatially delimited from the surroundings by means of the frame 7. The frame 7 advantageously protects the radiation-emitting semiconductor components 2 against, for example, environmental influences such as impacts, for example.

An electrically insulating layer 4 is preferably at least partly arranged on the radiation-emitting semiconductor components 2 and on the planarization layer 3. The electrically insulating layer 4 has in each case a cutout in a region of the first contact area 21 of the radiation-emitting semiconductor components 2.

The electrically insulating layer 4 is preferably at least partly radiation-transmissive to the radiation of the radiation-emitting semiconductor components 2 which is emitted by the active layer. The radiation emitted by the radiation-emitting semiconductor components 2 can thus be coupled out through the electrically insulating layer 4 without significant optical losses being incurred in the process.

In the exemplary embodiments in FIGS. 1 to 7, the radiation coupling-out of the radiation emitted by the radiation-emitting semiconductor components 2 from the module is preferably effected on that side of the module which is remote from the carrier substrate 1.

The electrically insulating layer 4 is preferably a film, a resist or a polymer layer.

The electrically insulating layer 4 can, just like the planarization layer 3, contain at least one conversion element (not illustrated). The conversion element in the electrically insulating layer preferably at least partly absorbs radiation of the radiation emitted by the radiation-emitting semiconductor components 2 and emits a secondary radiation in a different wavelength range. As a result, the module emits mixed radiation containing both primary radiation of the radiation-emitting semiconductor components 2 and secondary radiation of the conversion element.

By virtue of the fact that the conversion element or the conversion elements is or are integrated directly in the electrically insulating layer 4 and/or in the planarization layer 3, advantageously no further additional optical layers are required. Optical layers are, for example, layers which alter and/or correct the color locus of the radiation emitted by the semiconductor components in a targeted manner. The radiation emitted by the semiconductor components 2 can thus advantageously be converted close to the semiconductor components 2. A compact module is made possible.

The electrically insulating layer 4 has cutouts in regions. Preferably, a cutout in the electrically insulating layer 4 is formed in each case in a region of the first contact area 21 of a radiation-emitting semiconductor component 2.

Preferably, the electrically insulating layer 4 is embodied in one piece.

On that surface of the module which is remote from the carrier substrate 1, conductive structures are arranged in regions on the electrically insulating layer 4 (not illustrated).

The module prior to application of the conductive structures is illustrated in the exemplary embodiment in FIG. 1. The module in exemplary embodiment 1 accordingly shows a module during the production process.

In the exemplary embodiment in FIG. 1, a stencil 5 is arranged on that side of the module which is remote from the carrier substrate 1. The stencil 5 is employed during the production step of applying the conductive structures.

The stencil 5 is used for the structuring of the conductive structures. In particular, the stencil 5 preferably has cutouts in the region of the cutouts of the electrically insulating layer 4.

The conductive structures are applied to the electrically insulating layer 4 or to the stencil 5 preferably by means of a printing method. By means of a printing method, in particular a screen printing or pad printing method, it is thus possible to apply a, preferably monolayer, conductive structure, in particular a metallization layer, for the interconnection of the radiation-emitting semiconductor components 2.

The structuring of the conductive structures is preferably formed by means of the stencil 5 such that the radiation-emitting semiconductor components 2 are electrically conductively connected to one another or to conductor tracks of the carrier body by means of the conductive structures in an envisaged manner. Consequently, the conductive structures electrically connect at least the first contact area of a radiation-emitting semiconductor component 2 to a further first contact area of a further radiation-emitting semiconductor component 2 or to a conductor track of the carrier substrate 1 (not illustrated).

After application of the conductive structures, the stencil 5 is removed. Therefore, the stencil 5 is arranged on the module only temporarily during the production process.

Figure 2:
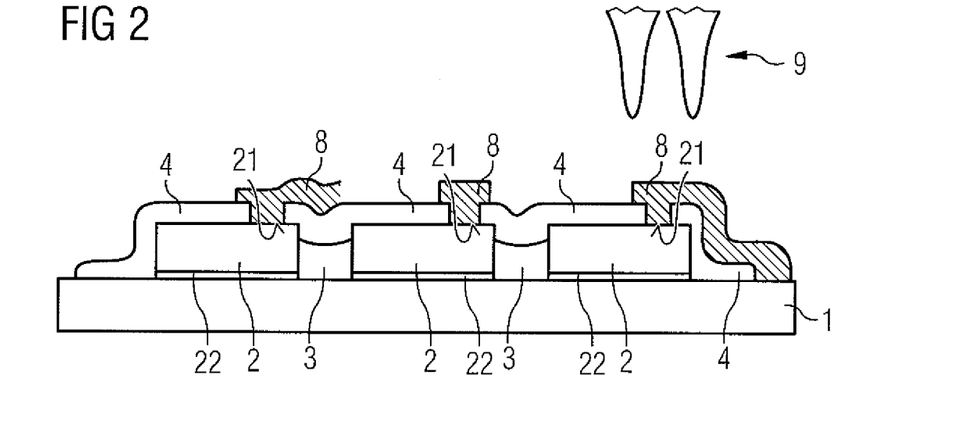
FIG. 2 shows a schematic cross section of a further exemplary embodiment of a module according to the invention.

An exemplary embodiment of a finished module comprising conductive structures 8 is illustrated in the exemplary embodiment in FIG. 2.

In contrast to the exemplary embodiment illustrated in FIG. 1, the module from FIG. 2 does not have a frame arranged on the carrier substrate 1 and surrounding the radiation-emitting semiconductor components 2 and the planarization layer 3.

The radiation-emitting semiconductor components 2 are preferably fixed on the structured conductor tracks of the carrier substrate 1 by means of a solder or an electrically conductive adhesive.

As in the exemplary embodiment in FIG. 1, an electrically insulating layer 4 is applied on the radiation-emitting semiconductor components 2 and the planarization layer 3. The electrically insulating layer 4 has cutouts in regions of the first contact area 21 of the radiation-emitting semiconductor components 2. Said cutouts are preferably produced by means of a laser method or a lithography method.

In contrast to the exemplary embodiment from FIG. 1, the conductive structures 8 are applied to the electrically insulating layer 4 by means of a jet printing method, for example. The conductive structures 8 are preferably applied by means of a nozzle 9. The nozzle 9 writes the conductive structures, preferably monolayer metal tracks, onto that side of the module which is remote from the carrier substrate 1. In particular, the conductive structures 8 are applied on the electrically insulating layer 4 in such a way that the radiation-emitting semiconductor components 2 are electrically contact-connected among one another or to a conductor track of the carrier substrate 1. In particular, the conductive structures 8 are situated in each case in the region of the first contact area 21 of the radiation-emitting semiconductor components 2.

The radiation-emitting semiconductor components 2 can thus be grounded separately. Alternatively, the radiation-emitting semiconductor components 2 can be electrically conductively connected to one another.

Figure 3:
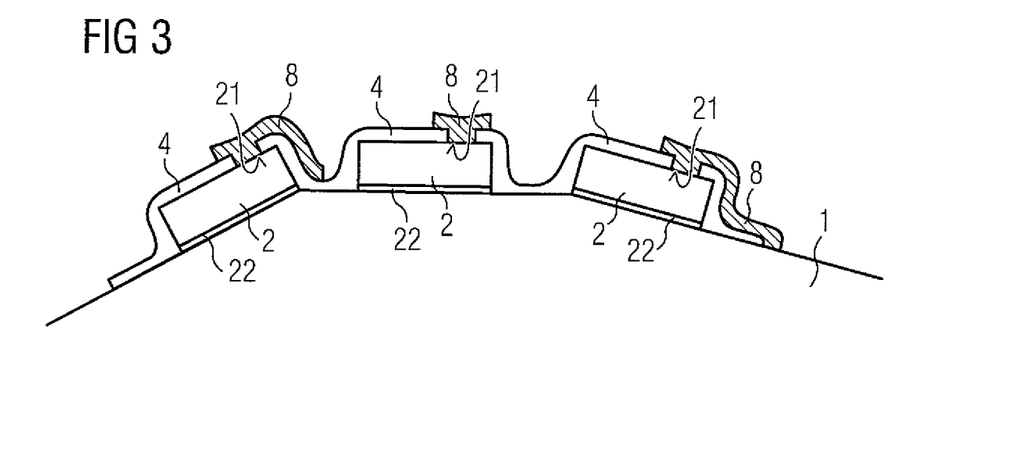
FIG. 3 shows a schematic cross section of one exemplary embodiment of a module according to the invention.

The exemplary embodiment in FIG. 3 differs from the exemplary embodiment from FIG. 2 in that the carrier substrate 1 is a flexible substrate. In particular, that surface of the carrier substrate 1 on which the radiation-emitting semiconductor components 2 are arranged is non-planar. The carrier substrate 1 can have a curvature, for example. In particular, the surface of the carrier substrate 1 can also have other shapings as long as mounting of the radiation-emitting semiconductor components 2 is possible.

In particular, the module can be mounted in rotatable fashion in the exemplary embodiment in FIG. 3. This advantageously simplifies the production of the module, for example. During the method step of writing the conductive structures by means of a nozzle, the module can be moved, for example rotated, for example in accordance with a desired structuring of the conductive structures.

Figure 4:
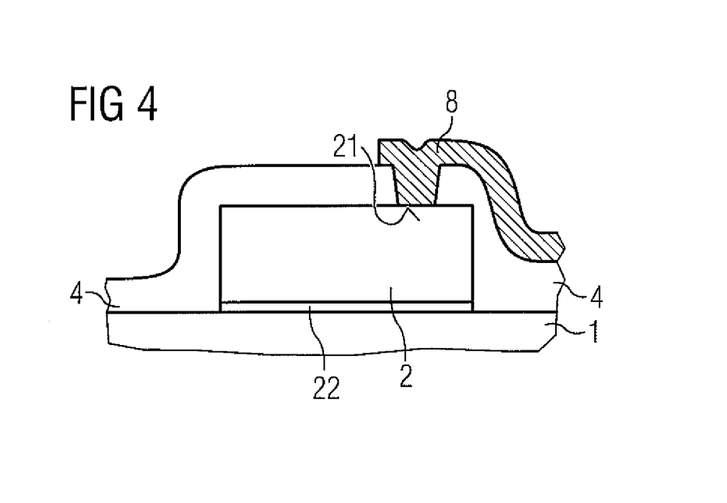
FIG. 4 shows a schematic excerpt from a further exemplary embodiment of a module according to the invention.

An excerpt from an optoelectronic module is illustrated in the exemplary embodiment in FIG. 4. In particular, only one radiation-emitting semiconductor component 2 of the module is illustrated. The further radiation-emitting semiconductor components of the module are not shown, for the sake of clarity.

On a carrier substrate 1, radiation-emitting semiconductor components 2 are preferably adhesively bonded by means of an adhesive layer or soldered by means of a solder. As illustrated in FIG. 4, an electrically insulating layer 4 is preferably arranged on the radiation-emitting semiconductor components 2 and on the carrier substrate 1. The electrically insulating layer 4 is, for example, a laminated-on film or a layer comprising glass.

The electrically insulating layer 4 has a cutout in the region of the first contact area 21 of the radiation-emitting semiconductor component 2. The electrically insulating layer 4 is preferably a dielectric layer.

Preferably, during the module production process, a conductive structure, particularly preferably a metal layer is deposited onto the electrically insulating layer 4 by means of vapor deposition over the whole area (not illustrated). Preferably, the whole-area conductive structure is deposited by means of physical or chemical vapor deposition. Afterward, the conductive structure formed over the whole area is structured, for example, by means of photolithography and etching in accordance with a desired interconnection of the radiation-emitting semiconductor components 2. In particular, the whole-area conductive structure is preferably structured such that the radiation-emitting semiconductor components are electrically conductively connected to one another or a radiation-emitting semiconductor component 2 is electrically conductively connected to a conductor track of the carrier substrate 1.

Preferably, for simplified and improved process implementation, the electrically insulating layer, in particular the dielectric layer, is planarized before the deposition of the conductive structure, for example by means of an SOG method.

Figure 5:
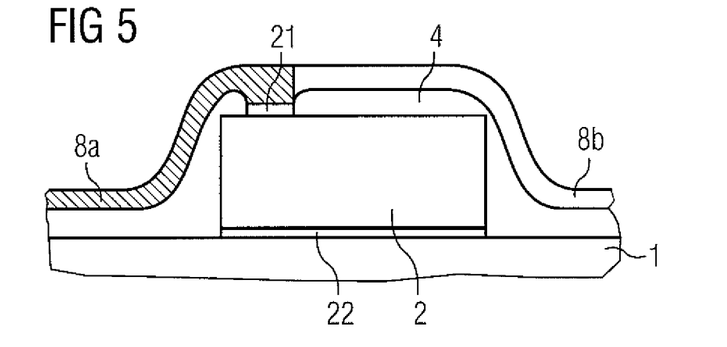
FIG. 5 shows a schematic excerpt from a further exemplary embodiment of a module according to the invention.

An excerpt from a further optoelectronic module is illustrated in the exemplary embodiment concerning FIG. 5. In this case, too, only one radiation-emitting semiconductor component 2 is illustrated, for the sake of clarity.

In contrast to the exemplary embodiment illustrated in FIG. 4, the conductive structure 8 is formed by an anisotropic layer 8a, 8b. Preferably, the anisotropic layer 8a, 8b is an anisotropic film, which is preferably applied by lamination.

The anisotropic layer preferably has two partial regions 8a, 8b. One of the partial regions 8a is preferably embodied in conductive fashion. Another partial region 8b, by contrast, is electrically insulating.

The formation of the conductivity in the region 8a of the anisotropic layer is preferably effected by means of a locally applied pressure or irradiation. An electrical connection of the radiation-emitting semiconductor component 2 in the region of the first contact area 21 is advantageously ensured as a result.

Preferably in the second partial region 8b, the anisotropic layer 8a, 8b is at least partly radiation-transmissive to the radiation emitted by the radiation-emitting semiconductor component 2. Alternatively, the anisotropic layer 8a, 8b can be selectively removed in the second partial region 8b after being applied by lamination. In this case, the anisotropic layer 8a, 8b need not be radiation-transmissive.

Figure 6:
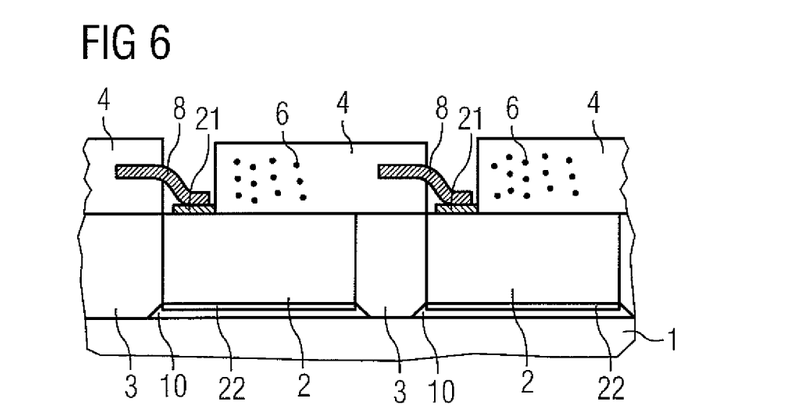
FIG. 6 shows a schematic cross section of a further exemplary embodiment of a module according to the invention.

The exemplary embodiment of an optoelectronic module as illustrated in FIG. 6 comprises a plurality of radiation-emitting semiconductor components 2, which are fixed on a carrier substrate 1 by means of a solder or an adhesive layer 10. Preferably, second contact areas 22 of the radiation-emitting semiconductor components 2 are in electrical contact with conductor tracks arranged on the carrier substrate 1. The conductor tracks of the radiation-emitting semiconductor components 2 are preferably arranged in a manner electrically insulated from one another.

In contrast to the modules illustrated in the previous exemplary embodiments, in the exemplary embodiment in FIG. 6, the electrically insulating layer 4 is formed by a structured circuit board and the conductive structures 8 are formed by electrically conductive webs, for example metal webs, projecting from the circuit board.

The circuit board comprises, in particular, an electrically insulating material with electrically conductive conductor tracks contained therein. Particularly preferably, the electrically insulating material of the circuit board is at least partly radiation-transmissive to the radiation emitted by the radiation-emitting semiconductor components 2. The electrically insulating material of the circuit board can furthermore contain at least one conversion element in order to convert the radiation emitted by the radiation-emitting semiconductor components 2.

The conductor tracks contained in the electrically insulating material of the circuit board are preferably at least partly electrically conductively connected to the metal webs 8. Furthermore, the metal webs 8 are in each case preferably electrically conductively connected to the first contact area 21 of a radiation-emitting semiconductor component 2. For this purpose, the circuit board 4 has in each case a cutout in the region of the first contact area 21 of a radiation-emitting semiconductor component 2.

The radiation-emitting semiconductor components 2 are in each case electrically contact-connected by means of the webs 8 and by means of the conductor tracks of the circuit board 4. In this case, the radiation-emitting semiconductor components 2 can be electrically conductively connected to one another or electrically conductively connected respectively to a conductor track of the carrier substrate 1.

The metal webs 8 are preferably shaped such that they are curved from the contact location of the circuit board in the direction of the radiation-emitting semiconductor components 2.

In this exemplary embodiment, it is also possible for a plurality of circuit boards to be arranged one above another, such that a multilayered arrangement and hence multilayered interconnection planes are formed in the module (not illustrated).

The metal webs 8 can, for example, in each case be electrically and mechanically connected to the first contact area 21 of the radiation-emitting semiconductor components 2 by means of a stamping-wedge process.

Figure 7A:
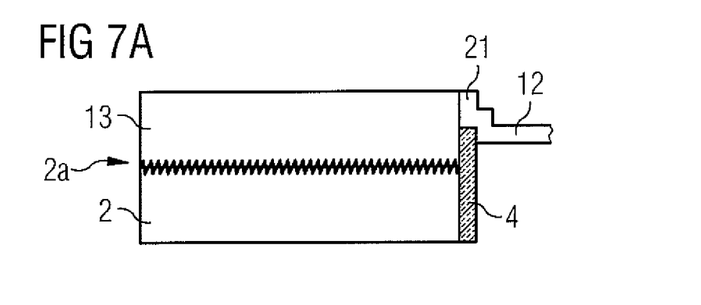
FIG. 7A shows a schematic excerpt from a further exemplary embodiment of a module according to the invention.
Figure 7B:
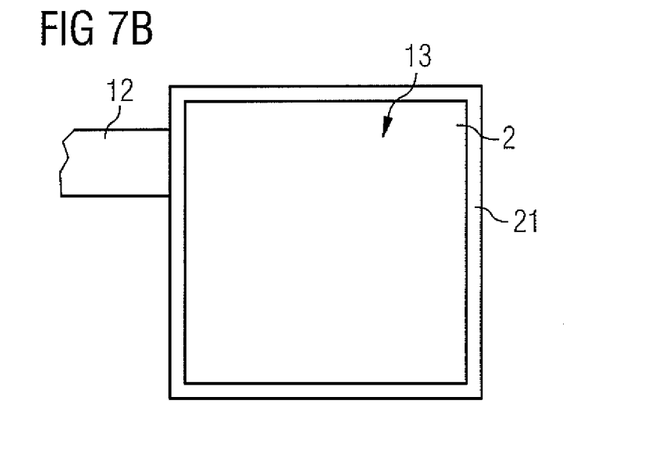
FIG. 7B shows a schematic plan view of the excerpt from the exemplary embodiment from FIG. 7A.

FIGS. 7A and 7B each illustrate a schematic excerpt from an optoelectronic module. FIG. 7A illustrates a cross section of an excerpt from a module. FIG. 7B shows in this respect a plan view of the excerpt from FIG. 7A.

FIG. 7A shows a radiation-emitting semiconductor component 2. An optoelectronic module is preferably composed of a plurality of radiation-emitting semiconductor components 2, which is illustrated in FIG. 7A, for example, wherein the radiation-emitting semiconductor components 2 are preferably arranged on a carrier substrate 1.

The radiation-emitting semiconductor component 2 from FIG. 7A comprises, in contrast to the exemplary embodiments in FIGS. 1 to 6, a first contact area 21 that is led on the electrically insulating layer 4. For this purpose, the electrically insulating layer 4 is led in each case in regions at the side areas of the radiation-emitting semiconductor component 2 around the respective radiation-emitting semiconductor component 2. Preferably, the electrically insulating layer 4 is led at the side areas of the radiation-emitting semiconductor component 2 over the active layer 2a of the semiconductor component 2.

Preferably, the first contact layer 21 is likewise led at the side area of the semiconductor component 2. In particular, the first contact layer 21 is led on the electrically insulating layer 4. In this case, that surface of the radiation-emitting semiconductor component 2 which is remote from the carrier substrate is preferably free of the first contact area 21.

By virtue of the first contact layer 21 being led along the side areas of the semiconductor component 2, a homogeneous energization of the radiation-emitting semiconductor component 2 can be ensured.

Preferably, a region of the first contact layer 21 is adjoined by an electrical lead 12. By virtue of the first contact layer 21 being led along the side areas of the semiconductor component 2, electrical leads 12 for the electrical interconnection of the semiconductor components 2 can be led at any desired regions of the first contact layer 21. The semiconductor components of a module can thus be electrically interconnected with one another by means of the leads 12. Alternatively, the semiconductor components can be electrically connected separately from one another.

FIG. 7B illustrates a plan view of the contact routing of a semiconductor component from FIG. 7A. The first contact layer 21 is in this case arranged laterally with respect to a radiation coupling-out area of the semiconductor component 2. Preferably, the first contact layer 21 is embodied in a frame-type fashion. In particular, the first contact layer 21 forms a closed track. An electrical lead 12 serving for the interconnection of the semiconductor component 2 is arranged in regions at the first contact layer 21.

Preferably, in the exemplary embodiments in FIGS. 7A, 7B, a current distributing layer 13 is arranged on the radiation-emitting semiconductor component 2. In particular, the current distributing layer 13 is at least partly radiation-transmissive to the radiation emitted by the semiconductor component 2. By way of example, the current distributing layer 13 is an ITO layer or a ZnO layer.

The first contact layer 21 is preferably a metallization. The radiation coupling-out area of the semiconductor component 2 is preferably free of the metallization. Preferably, the metallization is led around the semiconductor component 2, thereby ensuring a more homogeneous energization than, for example, by bonding pads conventionally used.

Figure 7C:
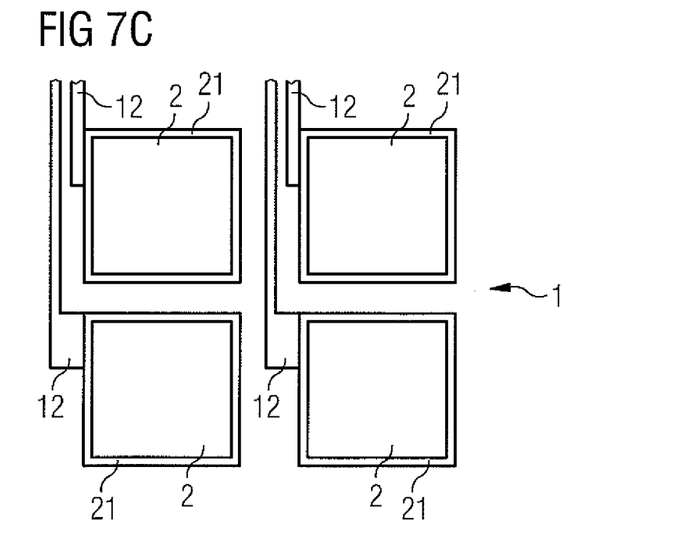
FIG. 7C shows a schematic plan view of a further exemplary embodiment of a module according to the invention.

FIG. 7C illustrates a plan view of a module comprising a plurality of radiation-emitting semiconductor components 2 from FIG. 7A. In this case, the module comprises four radiation-emitting semiconductor components 2. However, an alternative number of semiconductor components 2 is possible, depending on the respective application areas and intended uses of the module.

By virtue of the laterally arranged electrical routing of the first contact area 21 of the semiconductor components 2, a complex interconnection of the semiconductor components 2 is made possible. A space-saving arrangement of the semiconductor components 2 on the carrier substrate 1 is advantageously possible as a result.

In particular, there is the possibility of mounting the semiconductor components 2 individually onto the carrier substrate 1 and electrically conductively connecting them separately from one another. In this case, the carrier substrate 1 has on the mounting side for the semiconductor components 2 in each case conductor tracks which are electrically insulated from one another and on which a semiconductor component is in each case mechanically and electrically connected.

Alternatively, the semiconductor components 2 can be electrically interconnected with one another. In this case, preferably the carrier substrate 1 itself is embodied in electrically conductive fashion, such that the semiconductor components 2 are at a common electrical potential. Alternatively, a conductor track on which the semiconductor components 2 are jointly arranged can be arranged on the carrier substrate 1. The electrical leads 12 of the semiconductor components 2 are preferably led to a further electrical connection (not illustrated).

The invention is not restricted to the exemplary embodiments by the description on the basis of said exemplary embodiments, but rather encompasses any novel feature and also any combination of features, which in particular includes any combination of features in the patent claims, even if this feature or this combination itself is not explicitly specified in the patent claims or exemplary embodiments.

The invention claimed is:

1. An optoelectronic module comprising:
 carrier substrate; and
 a plurality of radiation-emitting semiconductor components on the carrier substrate, wherein:
 the carrier substrate has structured conductor tracks for making electrical contact with the radiation-emitting semiconductor components,
 the radiation-emitting semiconductor components each comprise an active layer suitable for generating electromagnetic radiation, a first contact area and a second contact area, wherein the first contact area is in each case arranged on a side of the radiation-emitting semiconductor components remote from the carrier substrate,
 a planarization layer is arranged at least between the radiation-emitting semiconductor components,
 an electrically insulating layer having a first part arranged on at least part of the radiation-emitting semiconductor components, the electrically insulating layer having respective cutouts in regions of the first contact areas of the radiation-emitting semiconductor components, and the electronically insulating layer having a second part arranged on at least part of the planarization layer,
 conductive structures are arranged on the electrically insulating layer, and
 one of the conductive structures electrically conductively connects at least the first contact area of a radiation-emitting semiconductor component to another first contact area of another radiation-emitting semiconductor component or to a conductor track of the carrier substrate.

2. The module according to claim 1, wherein the planarization layer comprises at least one conversion element.

3. The module according to claim 1, wherein the electrically insulating layer comprises at least one conversion element.

4. The module according to claim 1, wherein the radiation-emitting semiconductor components are jointly surrounded by a frame arranged on the carrier substrate.

5. The module according to claim 1, wherein the carrier substrate is a flexible substrate.

6. The module according to claim 1, wherein at least some of the radiation-emitting semiconductor components are arranged on a non-planar surface of the carrier substrate.

7. The module according to claim 1, wherein the conductive structures are formed by an anisotropic layer arranged on the electrically insulating layer, the anisotropic layer having electrically conductive regions at least in the region of the first contact area of the respective radiation-emitting semiconductor components.

8. The module according to claim 1, wherein the electrically insulating layer comprises a structured circuit board and the conductive structures comprise electrically conductive webs projecting from the circuit board.

9. The module according to claim 1, wherein:
the electrically insulating layer is in regions at side areas of the respective radiation-emitting semiconductor component, around the respective radiation-emitting semiconductor component, and
the first contact area of the radiation-emitting semiconductor components is in each case arranged on the electrically insulating layer so that a surface of the respective radiation-emitting semiconductor components remote from the carrier substrate is free of the first contact area.

* * * * *